United States Patent
Pellegrini

(10) Patent No.: US 12,227,409 B2
(45) Date of Patent: Feb. 18, 2025

(54) ROBUST INERTIAL SENSOR SELF-TEST

(71) Applicant: InvenSense, Inc., San Jose, CA (US)

(72) Inventor: Aurelio Pellegrini, Sestola (IT)

(73) Assignee: InvenSense, Inc., San Jose, CA (US)

( * ) Notice: Subject to any disclaimer, the term of this patent is extended or adjusted under 35 U.S.C. 154(b) by 521 days.

(21) Appl. No.: 17/546,928

(22) Filed: Dec. 9, 2021

(65) Prior Publication Data

US 2023/0183058 A1    Jun. 15, 2023

(51) Int. Cl.
*B81B 3/00* (2006.01)
*G01P 15/08* (2006.01)

(52) U.S. Cl.
CPC ............ *B81B 3/0051* (2013.01); *G01P 15/08* (2013.01); *B81B 2201/0235* (2013.01); *B81B 2201/0242* (2013.01); *G01P 2015/0868* (2013.01)

(58) Field of Classification Search
CPC .......... B81B 3/0051; B81B 2201/0235; B81B 2201/0242; G01P 2015/0868; G01P 15/08; G01P 21/00; G01C 19/5776; G01C 25/005
See application file for complete search history.

(56) References Cited

U.S. PATENT DOCUMENTS

| | | | |
|---|---|---|---|
| 10,761,108 B2 | 9/2020 | Zhang | |
| 11,112,269 B2 | 9/2021 | Clark | |
| 11,125,580 B1 * | 9/2021 | Avantaggiati | G01C 19/5776 |
| 11,169,174 B2 | 11/2021 | Oshima et al. | |
| 2004/0194532 A1 * | 10/2004 | Lally | G01L 25/00 73/1.38 |
| 2010/0063763 A1 * | 3/2010 | Rozelle | G01C 19/5691 702/92 |
| 2019/0154725 A1 | 5/2019 | Zhang | |
| 2020/0011702 A1 | 1/2020 | Clark | |
| 2021/0364546 A1 * | 11/2021 | Hughes | B81C 99/0045 |
| 2021/0396520 A1 | 12/2021 | Gregory et al. | |

OTHER PUBLICATIONS

International Search Report and Written Opinion received for PCT Patent Application No. PCT/US2022/046594, mailed on Feb. 13, 2023, 12 pages.

* cited by examiner

*Primary Examiner* — Victor A Mandala
(74) *Attorney, Agent, or Firm* — Van Hoven PC; Joshua Van Hoven; Stefan D. Osterbur

(57) ABSTRACT

An inertial sensor such as a MEMS accelerometer or gyroscope has a proof mass that is driven by a self-test signal, with the response of the proof mass to the self-test signal being used to determine whether the sensor is within specification. The self-test signal is provided as a non-periodic self-test pattern that does not correlate with noise such as environmental vibrations that are also experienced by the proof mass during the self-test procedure. The sense output signal corresponding to the proof mass is correlated with the non-periodic self-test signal, such that an output correlation value corresponds only to the proof mass response to the applied self-test signal.

21 Claims, 12 Drawing Sheets

ROBUST INERTIAL SENSOR SELF-TEST

BACKGROUND

Numerous items such as smartphones, smart watches, tablets, automobiles, aerial drones, appliances, aircraft, exercise aids, and game controllers utilize sensors during their operation (e.g., motion sensors, pressure sensors, temperature sensors, etc.). In commercial applications, microelectromechanical (MEMS) sensors such as accelerometers and gyroscopes capture complex movements and determine orientation or direction. For example, smartphones are equipped with accelerometers and gyroscopes to understand the movement of the smartphone, to augment navigation systems that rely on Global Position System (GPS) information, and to perform numerous other functions. Wearable devices and internet-of-things (IoT) devices constantly measure movement and other characteristics of a person, animal, or electronic device. In another example, drones and aircraft determine orientation based on gyroscope measurements (e.g., roll, pitch, and yaw), and vehicles of all types implement assisted driving to improve safety (e.g., to recognize skid or roll-over conditions). It may be desirable to perform a self-test procedure for an inertial sensor, for example, every time the sensor is turned on or on a predetermined schedule (e.g., daily, after a number of uses, etc.). These self-test procedures may be performed at the same time as a device that includes the sensor (e.g., a vehicle, wearable device, etc.) is put into use, during which vibrations such as a starting engine or moving user may impart environmental vibrations on the inertial sensor that interfere with the processing of the self-test procedure.

SUMMARY

In an embodiment of the present disclosure, a method for performing a self-test of an inertial sensor comprises generating, by processing circuitry of the inertial sensor, a non-periodic self-test signal pattern, providing the non-periodic self-test signal pattern to one or more self-test drive electrodes of the inertial sensor, and driving, by the one or more self-test drive electrodes, a proof mass of the inertial sensor in accordance with the non-periodic self-test signal pattern. The method may further comprise sensing, by one or more sense electrodes of the inertial sensor, the movement of the proof mass while the proof mass is driven by the one or more self-test drive electrodes. The method may further comprise the processing circuitry generating a sense signal based on the sensed movement of the proof mass, correlating the sense signal with the non-periodic self-test signal pattern, and identifying an error based on the correlating.

In an embodiment of the present disclosure, an inertial sensor with self-test capability comprises a signal generator that generates a non-periodic self-test signal pattern, one or more self-test drive electrodes that receive the non-periodic self-test signal pattern, a proof mass that is driven by the one or more self-test drive electrodes in accordance with the non-periodic self-test signal pattern. The inertial sensor may further comprise one or more sense electrodes that sense movement of the proof mass, sense circuitry coupled to the proof mass, wherein the sense circuitry is configured to generate a sense signal based on the sensed movement of the proof mass detected by the one or more sense electrodes, and processing circuitry configured to correlate the sense signal with the non-periodic self-test signal pattern and identify an error based on the correlation.

In an embodiment of the present disclosure, a method for performing a self-test of an inertial sensor comprises generating, by processing circuitry of the inertial sensor, a non-periodic self-test signal pattern, driving a proof mass of the inertial sensor in accordance with the non-periodic self-test signal pattern, and sensing, by one or more sense electrodes of the inertial sensor, the movement of the proof mass while the proof mass is driven by the one or more self-test drive electrodes. The method may further comprise the processing circuitry generating a sense signal based on the sensed movement of the proof mass, wherein the sensed movement is based on the driving of the proof mass and an environmental vibration, correlating the sense signal with the non-periodic self-test signal pattern, wherein an environmental vibration portion of the signal is not correlated with the non-periodic self-test signal pattern and a driven portion of the sense signal is correlated with the non-periodic self-test signal pattern, and identifying, by the processing circuitry, an error based on the correlating.

BRIEF DESCRIPTION OF DRAWINGS

The above and other features of the present disclosure, its nature, and various advantages will be more apparent upon consideration of the following detailed description, taken in conjunction with the accompanying drawings in which.

DETAILED DESCRIPTION OF DRAWINGS

A MEMS inertial sensor such as a MEMS accelerometer or a MEMS gyroscope includes a suspended spring-mass system including one or more proof masses that respond to a force of interest, such as a linear acceleration that causes the proof mass(es) of a MEMS accelerometer to move along a sense axis or a rotation about an axis that results in a Coriolis force along a perpendicular that causes the proof mass(es) of a MEMS gyroscope to move along that perpendicular axis. A self-test of the MEMS inertial sensor may be performed by testing the motion of the proof mass(es) in response to a particular applied force. Although in some instances such as during manufacturing the force may be applied externally such by a test fixture, once the sensor is released into a final product the self-test may need to be performed based on internal circuitry and components of the MEM inertial sensor, such as self-test electrodes that directly or indirectly impart a force on the proof mass(es) via the suspended spring-mass system.

A non-periodic self-test signal pattern may be applied to the suspended spring-mass system (e.g., by self-test electrodes) to cause the movement of the proof mass(es) in accordance with the non-periodic self-test signal pattern. This movement, along with any other movement due to external forces such as environmental vibrations, is sensed such as by a sense electrode and processed by sense circuitry (e.g., C2V converters, mixers, GOS circuitry, A/D converter, etc.) to output a sense signal representative of the movement of the proof mass(es). This signal is then processed by comparison circuitry, such as a correlator, for the sense signal to be compared to the original non-periodic self-test signal, which in turn may be delayed based on the propagation time of the provided non-periodic self-test drive signal via the suspended spring-mass system, and sense circuitry. In some embodiments, the correlator may be a feature-extraction block that seeks a special feature (e.g., the injected pattern) in the received signal. Other feature-extraction methods may be used to the same end such as, for example, machine learning techniques. The non-periodic self-test signal is selected such that it has minimal correlation with an environmental vibration that is likely to be experienced by the MEMS inertial sensor. In this manner, the environmental vibration will not impact a correlation value that is output by the correlator, such that this value is representative of only the portion of the sense signal that corresponds to the non-periodic self-test signal.

Figure 1:
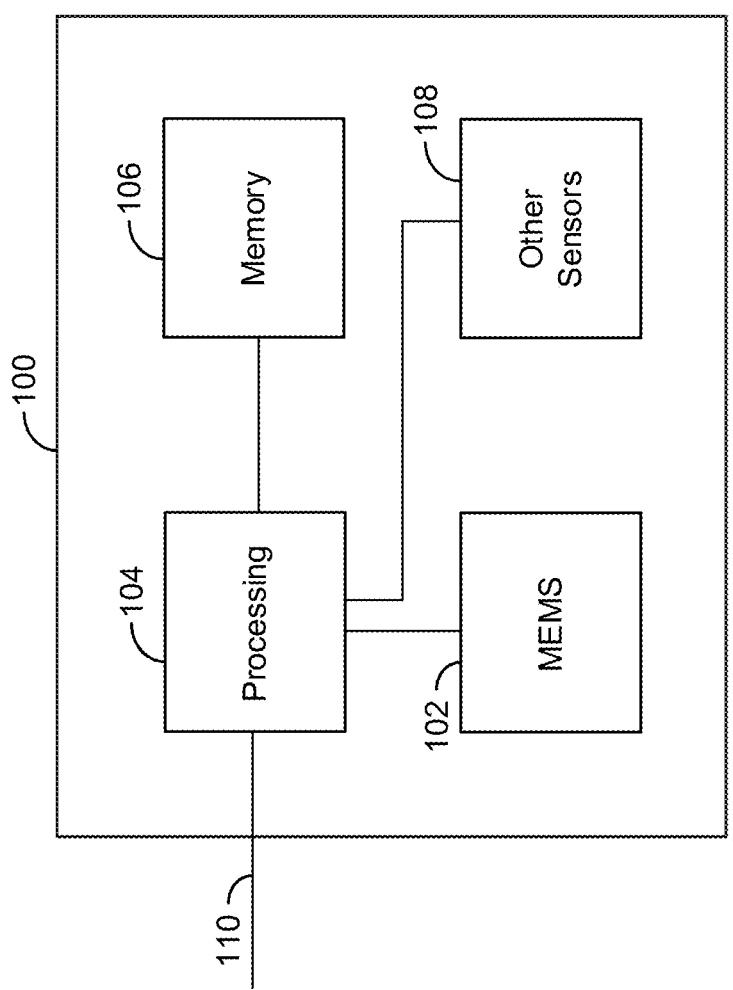
FIG. 1 shows an illustrative MEMS system in accordance with an embodiment of the present disclosure.

FIG. 1 depicts an exemplary MEMS system 100 in accordance with some embodiments of the present disclosure. Although particular components are depicted in FIG. 1, it will be understood that other suitable combinations of MEMS, processing components, memory, and other circuitry may be utilized as necessary for different applications and systems. In certain embodiments of the present disclosure, the circuitry, devices, systems, and methods described herein may be described in the context of a system including multiple MEMS inertial sensors including test circuitry for testing the suspended spring-mass system of the sensor while rejecting environmental noise. However, it will be understood that the circuitry, devices, systems, and methods described herein may be applied to other types of MEMS sensors and a rejection of a variety of noise sources. For example, if a stable background noise or vibration source is known to exist, the pattern injection may consist of a steady, periodic pattern that cancels out the noise at the signal input before it uses up the signal path's dynamic range. The correlation block may be used to adjust the pattern parameters (e.g., amplitude, frequency, and phase) for optimal cancellation.

In an embodiment as described herein, the MEMS system 100 may include at least a MEMS inertial sensor 102 (e.g., a single- or multi-axis inertial sensor for measuring motion along or about one or more axes) and supporting circuitry, such as processing circuitry 104 and memory 106. In some embodiments, one or more additional sensors 108 (e.g., MEMS gyroscopes, MEMS accelerometers, MEMS microphones, MEMS pressure sensors, temperature sensors, and a compass) may be included within the motion processing system 100 to provide an integrated motion processing unit ("MPU") (e.g., including 3 axes of MEMS gyroscope sensing, 3 axes of MEMS accelerometer sensing, microphone, pressure sensor, and compass).

Processing circuitry 104 may include one or more components providing necessary processing based on the requirements of the MEMS system 100. In some embodiments, processing circuitry 104 may include hardware control logic that may be integrated within a chip of a sensor (e.g., on a substrate or capacitor of a MEMS sensor 102 or other sensor 108, or on an adjacent portion of a chip to the MEMS sensor 102 or other sensor 108) to control the operation of the MEMS sensor 102 or other sensors 108 and perform aspects of processing for the MEMS sensor 102 or other sensors 108. In some embodiments, the MEMS sensor 102 and other sensors 108 may include one or more registers that allow aspects of the operation of hardware control logic to be modified (e.g., by modifying a value of a register). In some embodiments, processing circuitry 104 may also include a processor such as microprocessor that executes software instructions, e.g., that are stored in memory 106. The microprocessor may control the operation of the MEMS sensor 102 by interacting with the hardware control logic, and process signals received from MEMS sensor 102. The microprocessor may interact with other sensors in a similar manner. In some embodiments, some or all of the functions of the processing circuitry 104, and in some embodiments, of memory 106, may be implemented on an application specific integrated circuit ("ASIC") and/or a field programmable gate array ("FPGA").

Although in some embodiments (not depicted in FIG. 1), the MEMS sensor 102 or other sensors 108 may communicate directly with external circuitry (e.g., via a serial bus or direct connection to sensor outputs and control inputs), in an embodiment the processing circuitry 104 may process data received from the MEMS sensor 102 and other sensors 108 and communicate with external components via a communication interface 110 (e.g., a SPI or I2C bus, in automotive applications a controller area network (CAN) or Local Interconnect Network (LIN) bus, or in other applications suitable wired or wireless communications interfaces as is known in the art). The processing circuitry 104 may convert signals received from the MEMS sensor 102 and other sensors 108 into appropriate measurement units (e.g., based on settings provided by other computing units communicating over the communication bus 110) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS sensor 102 or other MEMS sensors 108.

In some embodiments, certain types of information may be determined based on data from multiple MEMS inertial sensors 102 and other sensors 108, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

In accordance with the present disclosure, a complex (e.g., non-periodic) test pattern may be generated and applied to self-test electrodes of MEMS sensor 102, which in turn may cause a movement of proof masses of a suspended spring-mass system of the MEMS sensor. The output sense signal of the MEMS sensor 102 during the time period that the test pattern is applied corresponds to the movement of the proof masses in response to the test pattern, as well as any external vibrations received during the time period. The sense signal may be compared to a delayed version of the applied test pattern signal (e.g., with the delay corresponding to the propagation time of the test pattern via the suspended spring-mass system) and processed by processing circuitry (e.g., correlation circuitry) such that portions of the sense signal related to the external vibration are substantially removed. The output corresponding to the correlated test pattern may be analyzed (e.g., compared to a threshold) to determine whether the MEMS sensor 102 is within specification.

Figure 2:
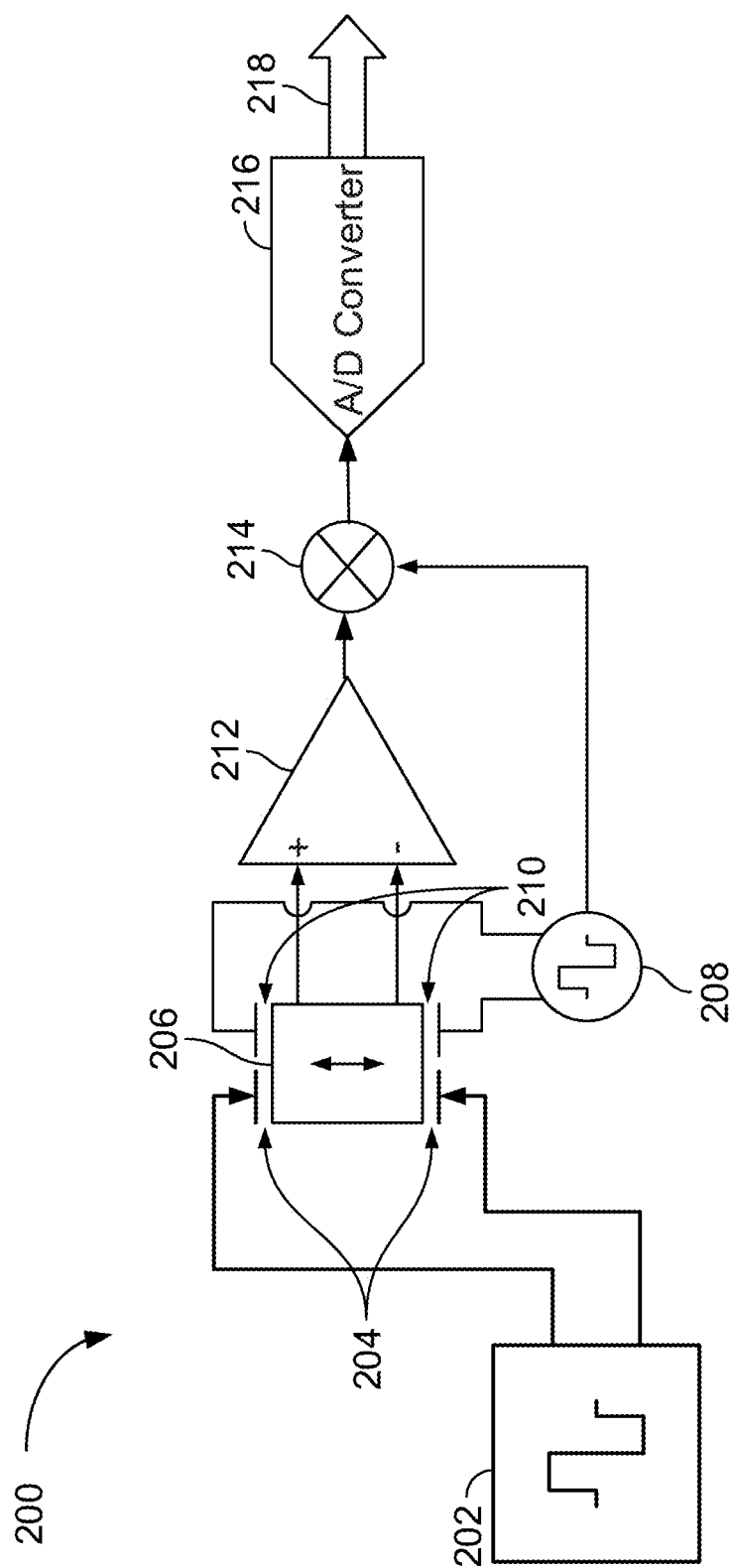
FIG. 2 shows an illustrative MEMS accelerometer with self-test in accordance with an embodiment of the present disclosure.

FIG. 2 shows an illustrative MEMS accelerometer with self-test in accordance with an embodiment of the present disclosure. In the depicted embodiment, an exemplary MEMS accelerometer 200 has a particular configuration for conducting a self-test, including a self-test signal generator 202, self-test drive electrodes 204, a proof mass 206 of a suspended spring-mass system, a drive signal generator 208, sense electrodes 210, a capacitance to voltage (C2V) converter 212, a frequency mixer 214, and an analog to digital converter 216. The illustrative MEMS accelerometer 200 of FIG. 2 is depicted as an in-plan accelerometer (e.g., responding to linear acceleration in the direction of the arrows depicted on proof mass 206), but it will be understood that the present discussion relates to other accelerometer configurations, such as out of plane sensing accelerometers, multi-proof mass accelerometers, etc. Although particular components are depicted in certain configurations for MEMS accelerometer 200, it will be understood that components may be removed, modified, or substituted, and that additional components (e.g., amplifiers, compensation circuitry, gain circuitry, offset circuitry, scaling circuitry, etc.) may be added in certain embodiments.

The exemplary MEMS accelerometer 200 includes a self-test signal generator 202, which couples to self-test drive electrodes 204 to provide a self-test drive signal to proof mass 206. The self-test signal generator 202 generates and delivers a periodic self-test signal (e.g., a square or sine wave) pattern, p(t), to self-test drive electrodes 204 to cause the proof mass 206 to move to simulate a linear vibration along the sense axis in accordance with the amplitude of the self-test signal. The self-test drive electrodes 204 receive the periodic self-test signal pattern, p(t), from self-test signal generator 202 and drive proof mass 206 according to the periodic self-test signal pattern, p(t) (e.g., at a frequency ranging from DC to 2 kHz). It will be understood that any suitable number of self-test drive electrodes 204 may be oriented on proof mass 206 in a variety of manners in accordance with the configuration of proof mass(es) for the particular MEMS accelerometer design. Each period of the periodic self-test signal pattern, p(t), delivered by self-test drive electrodes 204 includes two deflection pulses (e.g., a positive and a negative deflection pulse) applied in opposite directions on proof mass 206. The movement of proof mass 206 according to the periodic self-test signal pattern, p(t), is demonstrated in two embodiments by FIG. 3A and FIG. 3B, described in more detail below.

Sense electrodes 210 are located adjacent to the proof mass 206. A drive signal generator 208 generates a drive signal, e.g., a carrier signal, that is applied to the proof mass 206 via the sense electrodes. The drive signal adds frequency to the capacitance signals generated by the movement of proof mass 206. It will be understood that any suitable number of sense electrodes 210 may be oriented on proof mass 206 in any suitable manner, for example, such that drive signal may be applied to the proof mass 206 and to the sense electrode 210 via the proof mass. The signal generator of processing circuitry 208 additionally couples to frequency mixer 214. Sense electrodes 210 form capacitors with proof mass 206 for sensing the proof mass's 206 movement, in accordance with the periodic self-test signal pattern and any external vibrations along the sense axis, relative to the sense electrodes 210. The proof mass's 206 movement generates a change capacitance between sense electrodes 210 (e.g., parallel capacitor plates with respect to proof mass 206) and proof mass 206, which in the embodiment is output as a differential capacitances by proof mass 206 to C2V converter 212, although it will be understood that the capacitance changes may be measured from the sense electrodes 210 instead of or in addition to from the proof mass(es) 206.

The C2V converter 212 receives the capacitance output signals and converts the capacitance signals into a suitable output (e.g., voltage or current) that is based on (e.g., proportional to) the sensed differential capacitance voltage signals, and delivers the voltage signals to frequency mixer 214. The output of the C2V converter 212 couples to frequency mixer 214, which receives output voltage signals from C2V converter 212 and the drive signal from drive signal generator 208. Frequency mixer 214 cancels out the carrier drive signal from the received signal from C2V convertor, outputting the analog baseband sensed signal, including the response of the proof mass to the self-test signal pattern p(t) and any other sensed vibration while the self-test signal was applied to the proof mass. Analog to digital converter 216 receives the analog baseband sensed signal from frequency mixer 214 and converts this signal into a digital signal (e.g., sense signal 218, s(t)). Sense signal 218, s(t), serves as an output signal of analog to digital converter 216 and includes the injected periodic self-test signal pattern, p(t), and an environmental signal.

In some embodiments, a self-test for the MEMS accelerometer 200 includes taking a difference of a positive deflection point and a negative deflection point imparted by the applied self-test signal and comparing the difference to threshold values. In this manner, a movement that is substantially greater or less than an expected movement from the applied self-test signal may by indicative of damage to the accelerometer, such as damaged or worn springs. In an environment with background vibration acceleration (e.g., engine cranking in an automobile), environmental vibration may distort the reading associated with the self-test signal, resulting in the self-test incorrectly registering a "fail" or "pass" based on distortion to the self-test response of the proof mass to the self-test signal, not the self-test signal itself. Accordingly, certain vibration patterns may compromise self-test capability.

Figure 3:
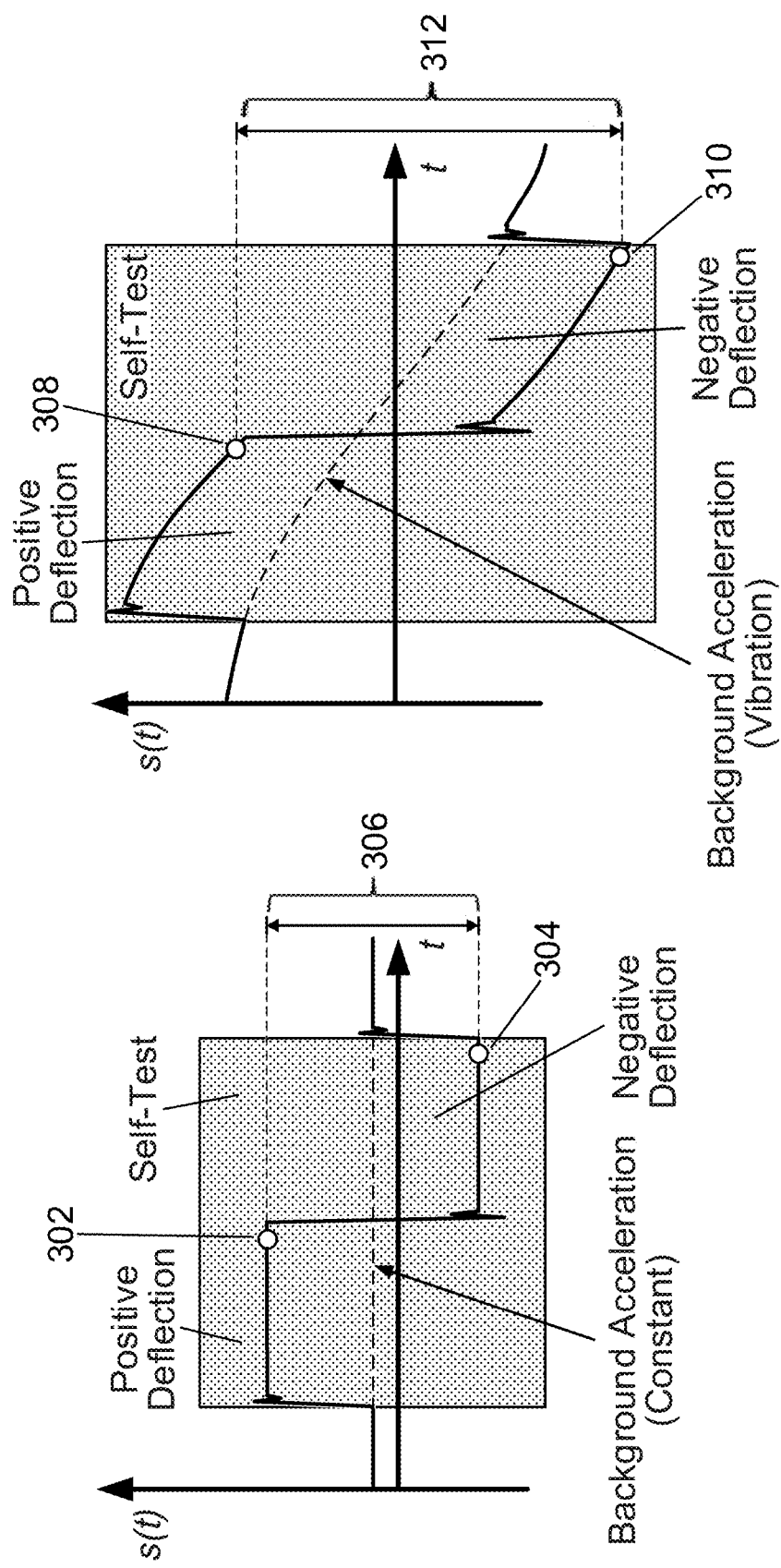
FIG. 3A shows an example diagram depicting a sense signal, s(t), as a function of time with constant background acceleration in accordance with an embodiment of the present disclosure.
FIG. 3B shows an example diagram depicting a sense signal, s(t), as a function of time with background vibration acceleration in accordance with an embodiment of the present disclosure.

FIG. 3A shows an example diagram depicting a sense signal, s(t), as a function of time with a constant background acceleration in accordance with an embodiment of the present disclosure. Although FIG. 3A shows two deflection pulses composing a single period of the sense signal, s(t), it will be understood that any suitable even number of deflection pulses may be recorded for any suitable number of periods of the sense signal, s(t). FIG. 3A shows an amplitude of sense signal, s(t), being recorded for each deflection pulse, which is conveyed by a peak-to-peak difference 306 between a positive deflection point 302 and a negative deflection point 304. It will be understood that other methods of measuring deflection pulse amplitude may be utilized, such as different measurement points or averaging. The peak-to-peak difference 306 between the positive deflection point 302 and the negative deflection point 304 is taken and compared to a threshold value. In the embodiment depicted in FIG. 3A, an acceleration is experienced during the time that the test signal is applied to the proof mass, depicted by the by the baseline acceleration (dotted) line exceeding zero. However, because the acceleration is constant, the peak-to-peak difference 306 is not affected by the background acceleration. Thus, the comparison of the peak-to-peak difference 306 will yield an accurate self-test result when compared to the threshold. In the embodiment of FIG. 3A, the peak-to-peak difference corresponds to a "Pass" on the self-test.

FIG. 3B shows an example diagram depicting a sense signal, s(t), as a function of time with background vibration acceleration in accordance with an embodiment of the present disclosure. Although FIG. 3B shows two deflection pulses composing a single period of the sense signal, s(t), it will be understood that any suitable even number of deflection pulses may be recorded for any suitable number of periods of the sense signal, s(t). FIG. 3B shows sense signal, s(t), being recorded at the end of each deflection pulse, which is conveyed by a positive deflection point 308 and a negative deflection point 310, although as described for FIG. 3A, other sensing times and/or methodologies may be utilized. A peak-to-peak difference 312 of the positive deflection point 308 and the negative deflection point 310 is taken and compared to a threshold value. In the embodiment depicted in FIG. 3B, a background vibration causes an acceleration that is time-varying, such that the background acceleration (depicted with a dotted line) changes during the time period that the self-test signal is applied to the proof mass(es). As depicted in FIG. 3B, during the time between measurement of positive deflection point 308 and negative deflection point 310, the background acceleration decreases significantly. This results in the peak-to-peak difference 312 exceeding that actual difference due to the test signal, causing incorrect test results when compared to test thresholds. Accordingly, non-constant background accelerations negatively impact the accuracy of accelerometer self-test determinations. Because MEMS sensors are often installed in vehicles or other devices that create substantial vibrations, or are used in environments where such vibrations are regularly experienced, this traditional approach to self-test sensing may be significantly limited in such devices and environments. For example, in the embodiment of FIG. 3B, the peak-to-peak difference 312 for the same displacement as in FIG. 3A results in a "Fail" of the self-test.

Figure 4:
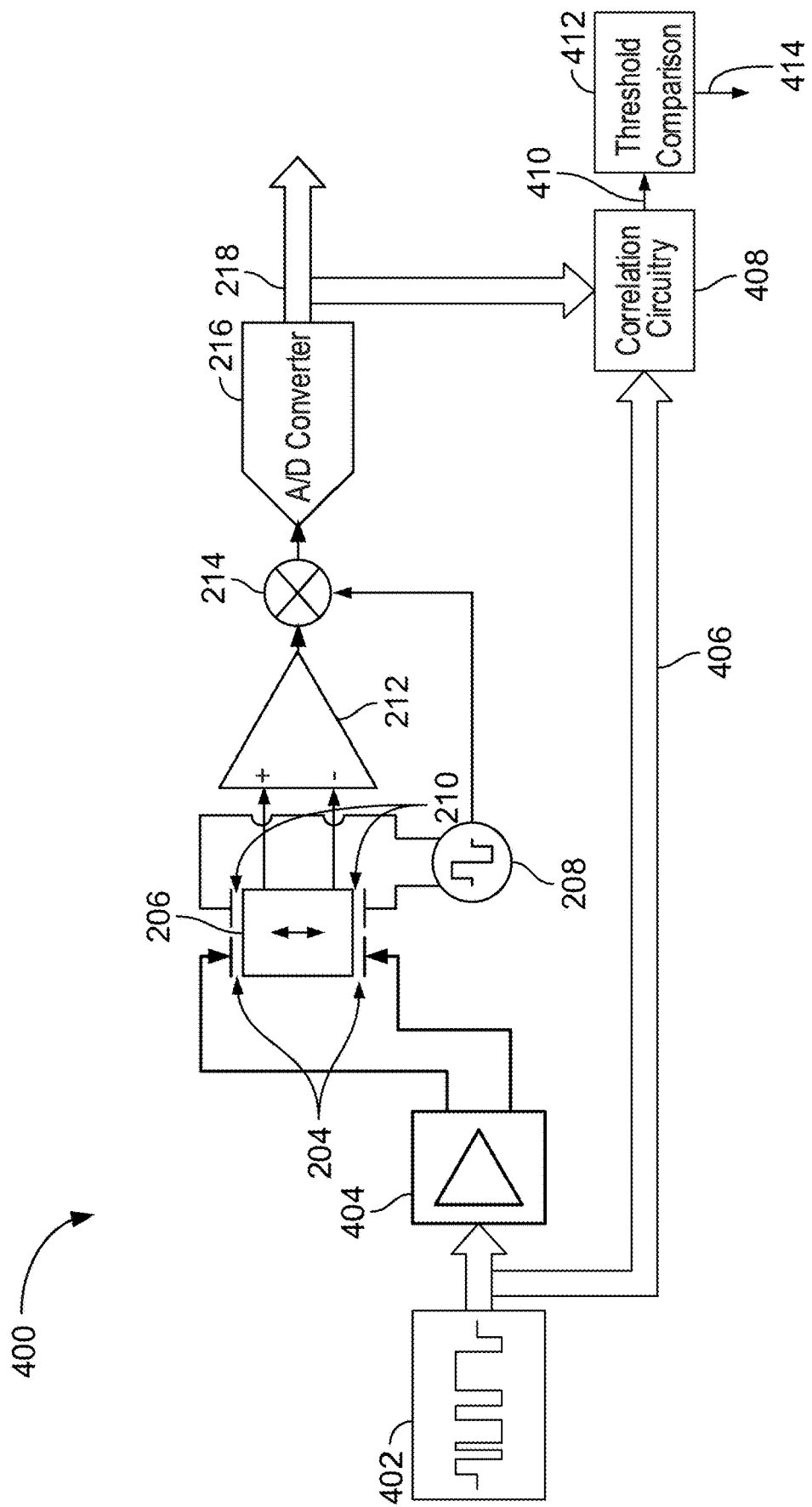
FIG. 4 shows an illustrative MEMS accelerometer with a self-test robust to vibration in accordance with an embodiment of the present disclosure.

FIG. 4 shows an illustrative MEMS accelerometer with a self-test robust to vibration in accordance with an embodiment of the present disclosure. The components of the MEMS accelerometer 200 of FIG. 2 are depicted in MEMS accelerometer 400 of FIG. 4, except that self-test signal generator 402 replaces self-test signal generator 202, self-test drive 404 receives a non-periodic self-test signal pattern 406, p(t), from the self-test signal generator 402, self-test signal generator 402 delivers the non-periodic self-test signal pattern 406, p(t), to correlator 408, and correlator 408 delivers a correlation value 410 to test circuitry 412, which outputs a test output 414. Although not depicted in FIG. 4, a delay element may also be included in the signal path 406 between self-test signal generator 402 and correlator 408. As described with respect to FIG. 2, the MEMS accelerometer is not limited to the particular embodiment (components, sense axis, sensing configuration, etc.) depicted in FIG. 4, but can be applied to any MEMS accelerometer that is capable of being displaced by a self-test signal.

Self-test signal generator 402, which couples to self-test drive 404 and correlator 408, generates and delivers the non-periodic self-test signal pattern 406, p(t), to the self-test drive 404 and the correlator 408 to simulate a pattern of linear acceleration. In some embodiments, based on the power and characteristics of the self-test signal generator 402, a self-test drive 404 may not be necessary to drive the proof mass 206. The non-periodic self-test pattern is selected in a manner such that it is unlikely to correlate to environmental vibrations. In some embodiments, for example if an end use application is known, the non-periodic self-test pattern may be specifically designed to not correlate with particular likely vibrations, for example, at certain frequencies or patterns of frequencies. A non-periodic self-test pattern will typically include multiple cycles (e.g., at least 2) to impart enough non-periodicity to limit correlation of environmental signals. An example non-periodic self-test signal pattern 406, p(t), may include an anti-symmetric chirp pattern, which features zero average and variable frequency that results in little correlation error, $C_{err}$, with a fixed-frequency vibration, making the non-periodic self-test signal pattern 406, p(t), resistant against strong, low-frequency vibrations (e.g., engine cranking in an automobile). As another example, the non-periodic self-test signal pattern 406, p(t), may include a zero-average random pattern, which features zero average and "white noise" (e.g., a flat power spectral density) frequency content. This particular embodiment may be more effective against weak vibrations with broad frequency range (e.g., in the audio frequency range of 20 Hz to 20 kHz). The non-periodic self-test signal pattern 406, p(t), may be a zero average signal amplitude, to reject gravity or any other constant background acceleration will be rejected.

In some embodiments, the non-periodic self-test signal pattern 406, p(t), may be delayed by a delay time, wherein the delay time corresponds to a propagation time for the self-test drive electrodes 204 receiving the non-periodic self-test signal pattern 406, p(t), to processing circuitry generating the sense signal 218, s(t). The non-periodic self-test signal pattern 406, p(t), may be implemented as a sequence of +1 and −1 (e.g., square wave), which aids in applying the non-periodic self-test signal pattern 406, p(t), to the proof mass 206 via the self-test drive electrodes 204 and calculating the correlation value 410. In some embodiments, the non-periodic self-test signal pattern 406, p(t), may include a multi-valued amplitude pattern (e.g., based on a bit resolution, to simulate signal patterns such as sinusoids), which may result in a smaller correlation error, $C_{err}$.

Self-test drive 404 receives the non-periodic self-test signal pattern 406, p(t), from the self-test signal generator 402 and provides a signal to the self-test drive electrodes 204 to drive the proof mass 206 in accordance with the non-periodic self-test signal pattern 406. During the time period that the non-periodic self-test signal pattern 406 drives the proof mass 206, an environmental vibration (e.g., vibration due to an automotive motor, etc.) may also be experienced by the proof mass and cause it to move along the sense axis along with the movement imparted by the self-test electrodes. After processing by the C2V converter 212, mixer, 214, and A/D converter 216 (as well as any other circuitry, not depicted), an output sense signal 218, s(t), corresponds to the response of the proof mass 206 to the applied non-periodic self-test signal pattern 406 combined with the response of the proof mass to the environmental signal $s_e(t)$.

Correlator 408 receives the non-periodic self-test signal pattern 406, p(t), from self-test signal generator 402 and the sense signal 218, s(t), from analog to digital converter 216. The self-test signal pattern 406 may be delayed in accordance with a known propagation time for the self-test signal through the MEMS accelerometer circuitry, such that the start of the sense signal 218 and the start of the non-periodic self-test signal pattern 406 are aligned. The correlator 408 correlates the sense signal 218 with the non-periodic self-test signal pattern 406 over the time period during which the non-periodic self-test signal pattern 406 was applied to the proof mass 206. The resulting correlation value 410 thus represents the correlation of the non-periodic self-test signal pattern 406 to the sense signal, in turn, representing the degree to which the non-periodic self-test signal pattern 406 caused movement of the proof mass 408. Concurrently, correlator 408 substantially eliminates any impact of the environmental signal, $s_e(t)$, on the correlation value, based on the vibration not correlating with the non-periodic self-test signal pattern 406. Accordingly, a contribution of a correlation error, $C_{err}$ (e.g., a portion of the signal not corresponding to the desired signal corresponding to the self-test input) from sense signal 218 is minimized. Correlation value 410, generated from the correlation of the sense signal 218 with the non-periodic self-test signal pattern 406 by the correlator 408, is fed to test circuitry 412 by the correlator 408 and compared to a threshold value. The test circuitry 412 receives the correlation value 410 from corr-elator 408 and compares the correlation value 410 to the threshold value(s) to determine the test output 414. For example, if the correlation value 410 does not exceed a first threshold value, the test circuitry 412 registers the self-test as a "pass" on an upper threshold test via test output 414. As another example, if the correlation value 410 does not fall below a second threshold value, test circuitry 412 registers the self-test as a "pass" on a lower threshold test via output 414. Based on the proper selection of the self-test signal pattern, the threshold comparisons are based on the response of the proof mass to the non-periodic self-test signal pattern 406, not the external vibration. Other test protocols other than threshold comparisons may be used in addition to or as substitutes for the threshold comparison. Another exemplary test protocol may apply multiple different non-periodic self-test patterns and determine a pass or fail based on an average or other aggregation of multiple results. Another exemplary test protocol my apply different peak-to-peak signal amplitudes for the same or similar non-periodic self-test patterns, effectively testing a range of operation of the proof mass over the entirety of its operating range. Another exemplary test protocol monitors changes in the self-test signal response over time, for example, by monitoring for a rate of changes that exceeds a threshold.

Figure 5:
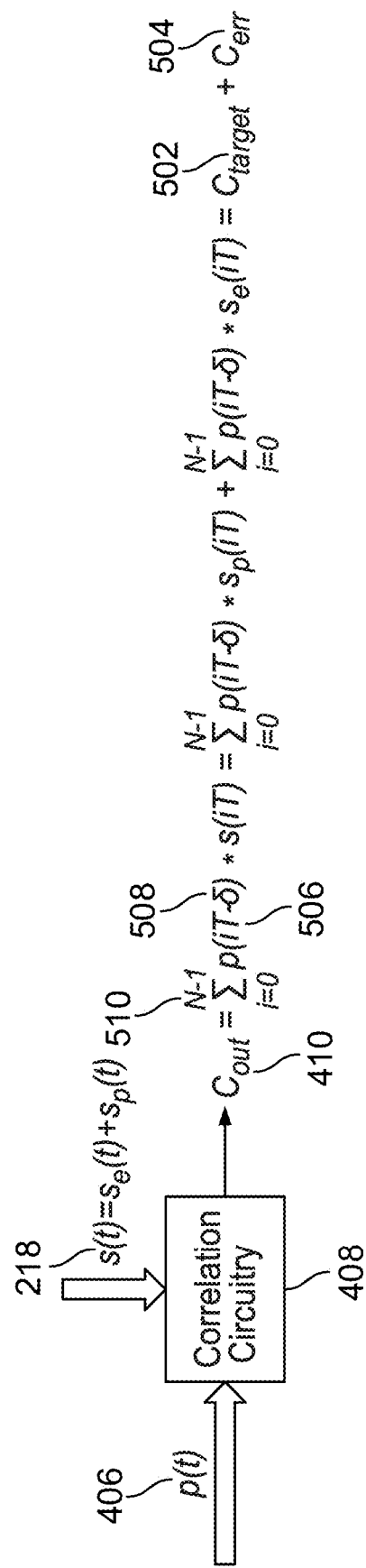
FIG. 5 shows an example MEMS correlator in accordance with an embodiment of the present disclosure.

FIG. 5 shows an example MEMS correlator in accordance with an embodiment of the present disclosure. Sense signal 218, s(t), and non-periodic self-test signal pattern 406, p(t), correlator 408, and correlation value 410, $C_m$, from FIG. 4 are depicted in FIG. 5. In addition, FIG. 5 depicts components that contribute to the correlation value 410, $C_m$, including a correlation target 502, $C_{target}$, a correlation error 504, $C_{err}$, a sample time interval duration 506, T, a delay time 508, δ, and a number of samples recorded 510, N.

The correlation value 410, $C_m$, is determined by a summation of the products of the sense signal 218, s(t), and non-periodic self-test signal pattern 406, p(t), over the number of samples recorded 510, N. The delay time 508, δ, corresponds to an adjustable delay used to compensate for a propagation time from the self-test drive electrodes receiving the non-periodic self-test signal pattern 406, p(t), to processing circuitry generating the sense signal 218, s(t). Correlation target 502, $C_{target}$, is an ideal correlation value (e.g., a correlation value based on the self-test signal absent any correlation error, $C_{err}$, caused by environmental influences), and correlation error 504, $C_e$n, is an error caused by the environmental vibrations. The correlation value 410, $C_{out}$, equals the sum of the correlation target 502, $C_{target}$, and the correlation error 504, $C_{err}$. Because there will be minimal correlation between the vibration portions of the sense signal 218 and the non-periodic test signal pattern 406, the value of $C_{err}$ will be minimized, such that $C_{out}$ substantially corresponds to $C_{target}$.

Figure 6:
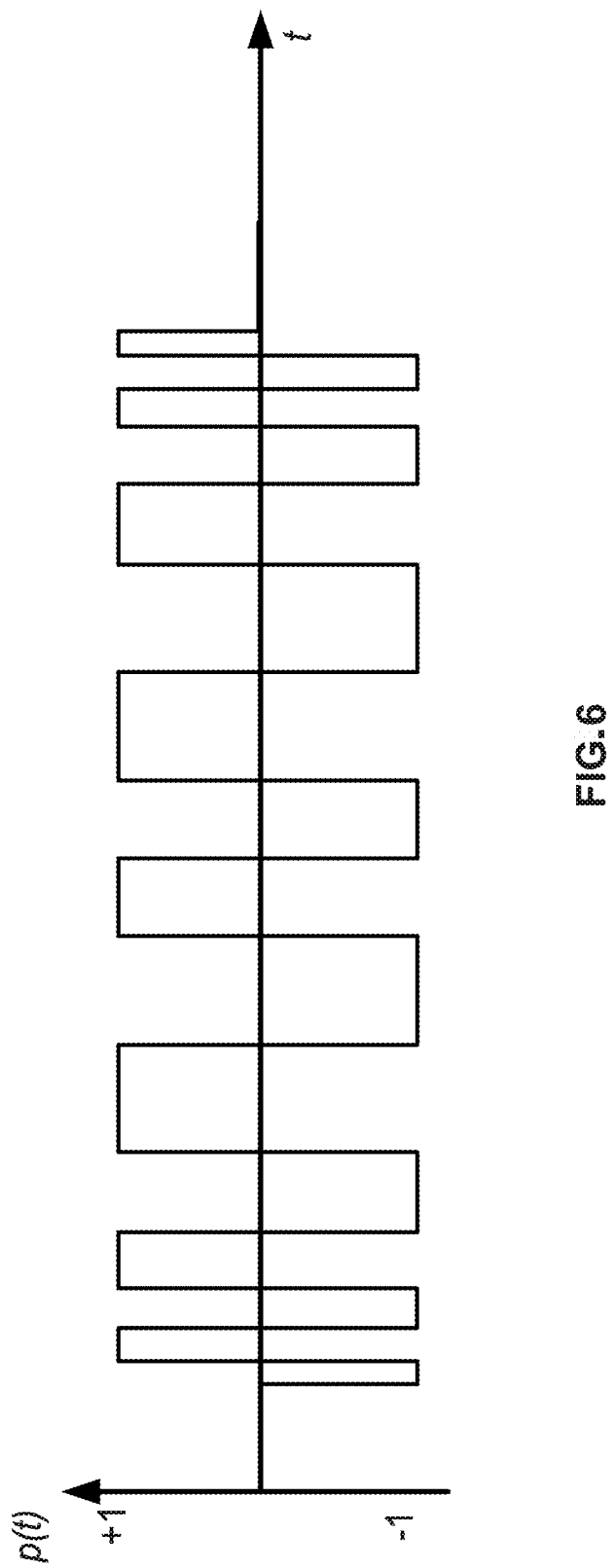
FIG. 6 shows an example diagram depicting an anti-symmetric chirp pattern in accordance with an embodiment of the present disclosure.

FIG. 6 shows an example diagram depicting an anti-symmetric chirp pattern in accordance with an embodiment of the present disclosure. An anti-symmetric chirp pattern is an example of a non-periodic self-test signal pattern 406 that will correlate minimally with an external vibration, thus reducing any $C_{err}$ contribution to an output correlation value. FIG. 6 depicts an example graph of the non-periodic self-test signal pattern, p(t), versus time, wherein the non-periodic self-test signal pattern, p(t), includes zero average and variable frequency that results in little correlation error, $C_{err}$, with a fixed frequency vibration, making the non-periodic self-test signal pattern, p(t), resistant against strong, low-frequency vibrations (e.g., an engine cranking in an automobile).

Figure 7:
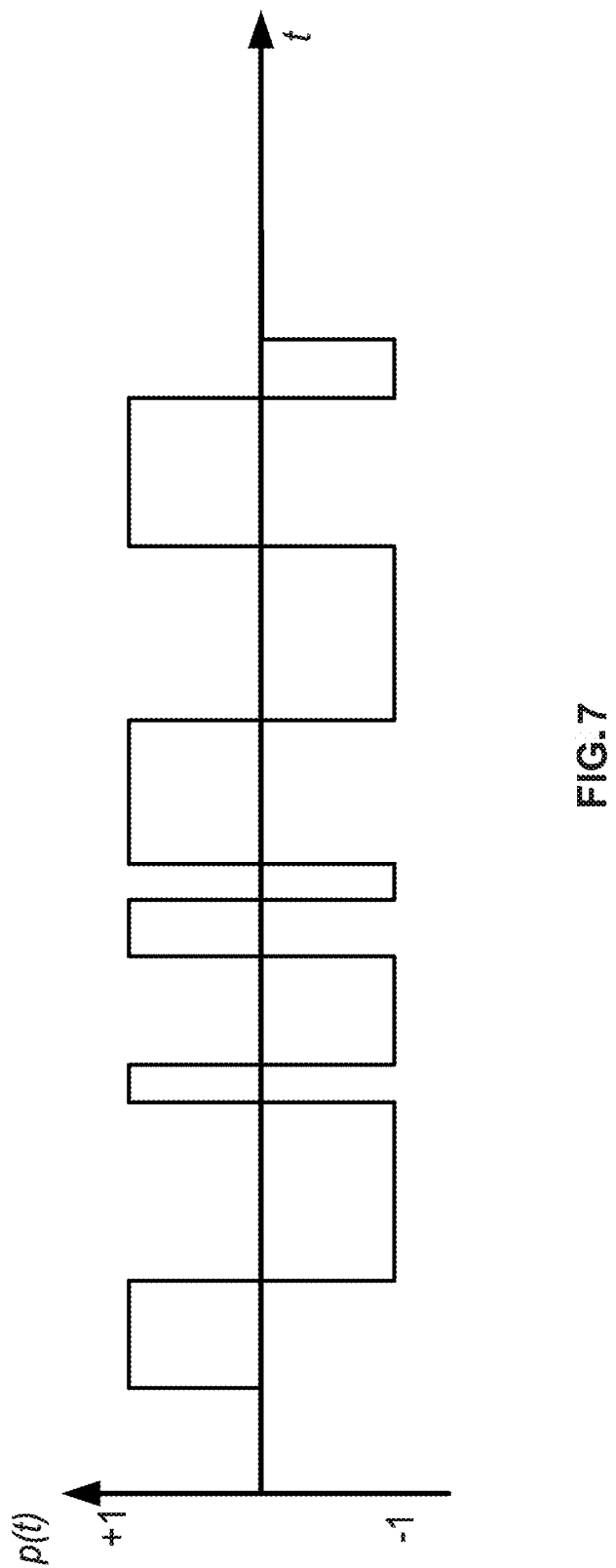
FIG. 7 shows an example diagram depicting a zero-average random pattern in accordance with an embodiment of the present disclosure.

FIG. 7 shows an example diagram depicting a zero-average random pattern in accordance with an embodiment of the present disclosure. FIG. 7 depicts an example graph of the non-periodic self-test signal pattern, p(t), versus time, wherein the non-periodic self-test signal pattern, p(t), includes zero average and "white noise" (e.g., a flat power spectral density) frequency content. This particular embodiment is more resistant against weak vibrations with broad frequency range (e.g., in the audio frequency range of 20 Hz to 20 kHz).

Figure 8A:
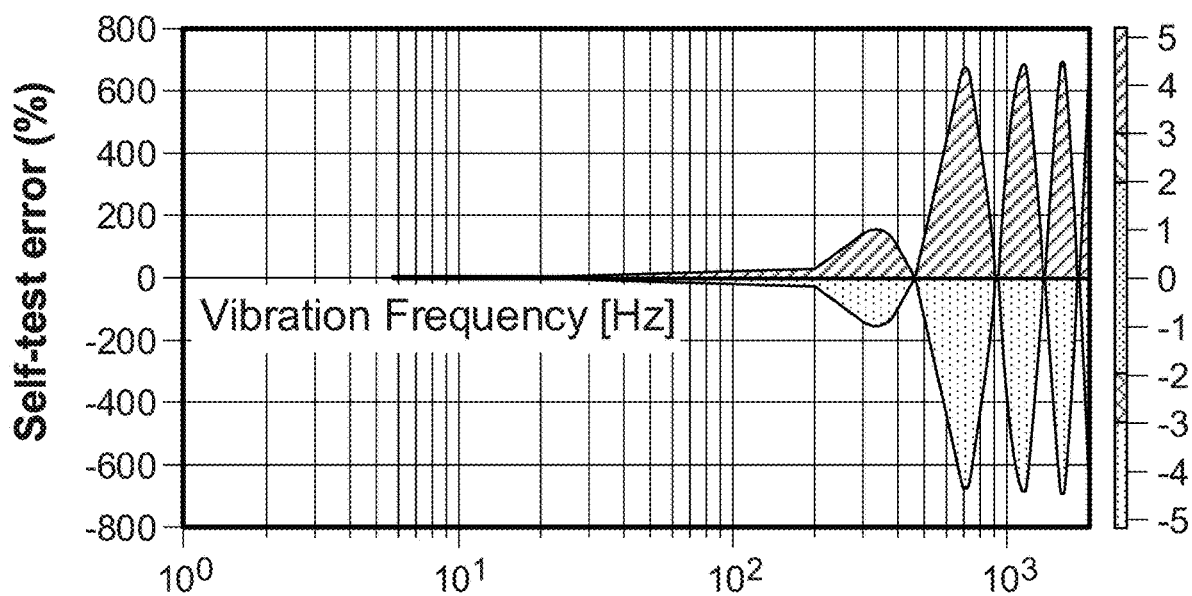
FIG. 8A shows an example diagram depicting self-test robustness to vibrations of a prior art self-test methodology.

FIG. 8A shows an example diagram depicting self-test robustness to vibrations of a prior art self-test methodology. FIG. 8A depicts a product (e.g., an automotive MEMS sensor) self-test simulated with Matlab, which represents simulated self-test error mask percentage at various external vibration frequencies (e.g., DC to 2 kHz). The maximum self-test error percentage exceeds 690%, which renders the product self-test unusable because the product can't reliably gauge its self-error in a high vibration environment (e.g., an engine cranking in an automobile) with such an exorbitant value. In this embodiment, the product is sensitive to linear vibration frequency.

Figure 8B:
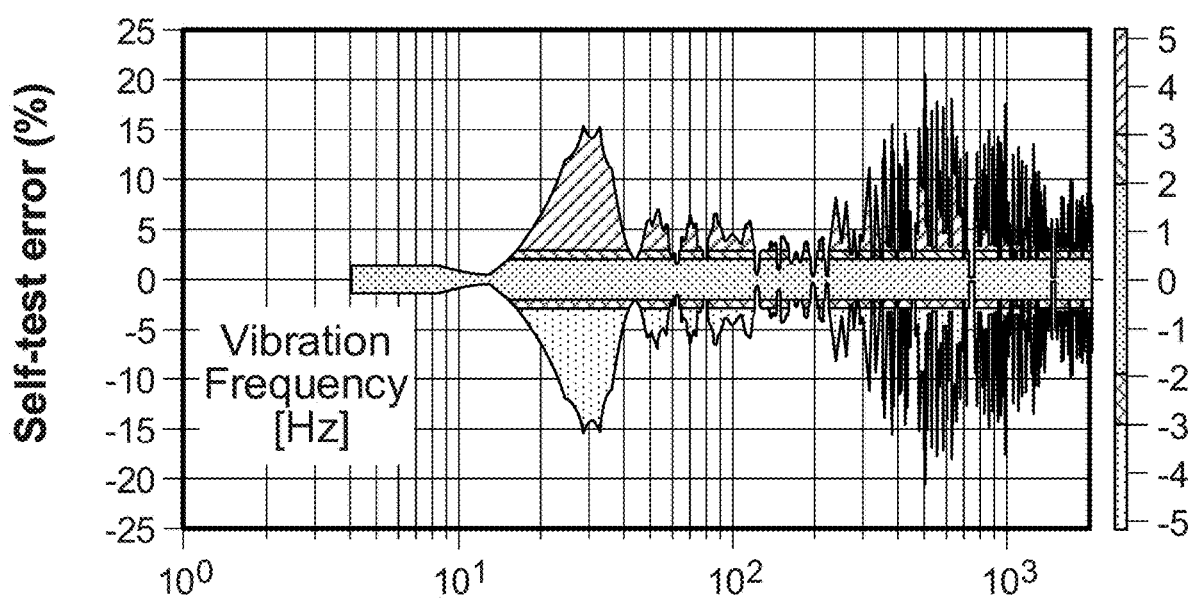
FIG. 8B shows an example diagram depicting self-test robustness to vibrations in accordance with an embodiment of the present disclosure.

FIG. 8B shows an example diagram depicting self-test robustness to vibrations in accordance with an embodiment of the present disclosure (e.g., utilizing the circuitry and self-test described with respect to FIGS. 4-5). FIG. 8B depicts the same product used in FIG. 8A (e.g., an automotive MEMS sensor) self-test simulated with Matlab using a non-periodic self-test pattern in accordance with the present disclosure, which represents simulated self-test error mask percentage at various linear vibration frequencies (e.g., DC to 2 kHz). The maximum self-test error percentage reaches 21%, which demonstrates the relative robustness to linear vibration frequency and allows the product to gauge and analyze its self-error when operating in a high vibration environment (e.g., an engine cranking in an automobile).

Figure 9:
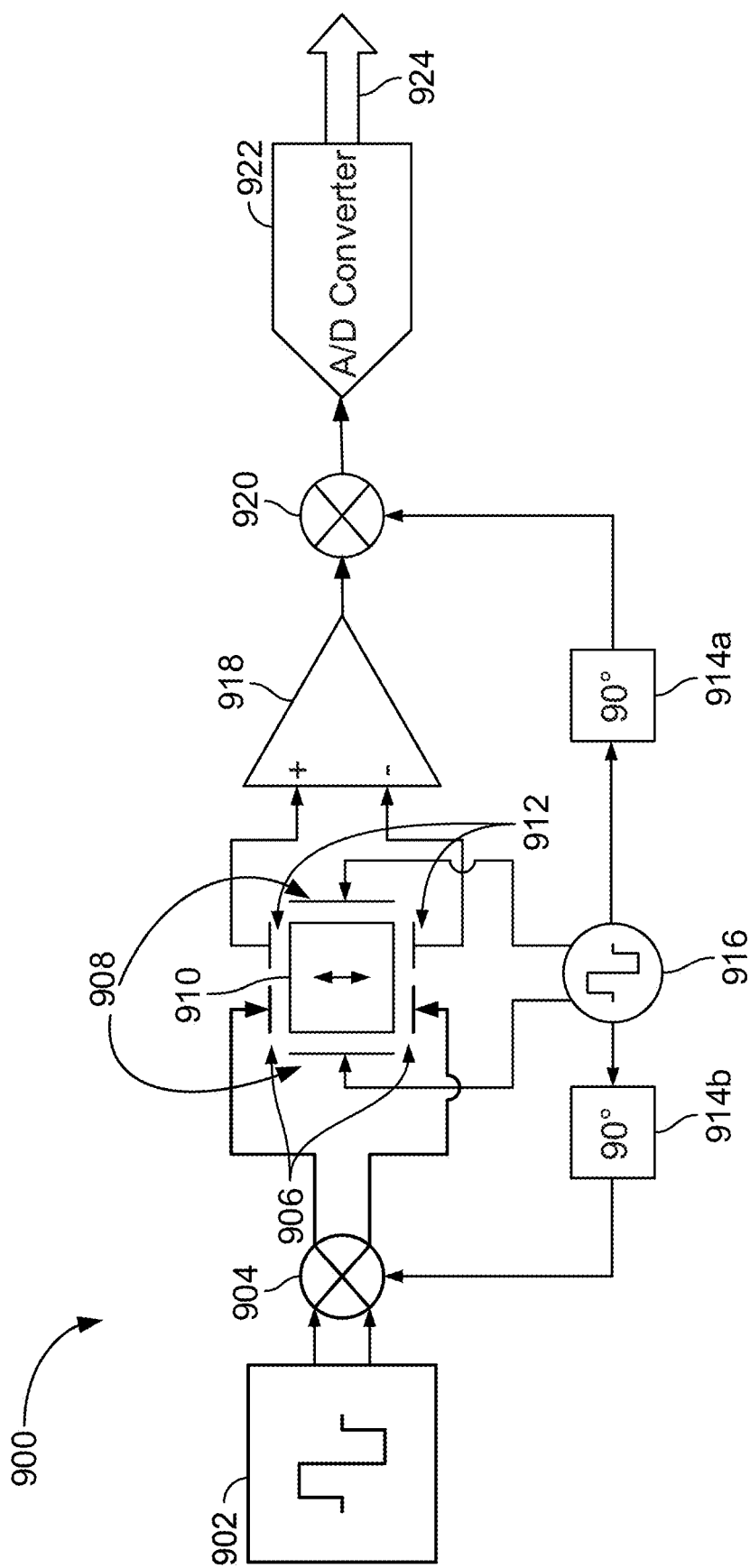
FIG. 9 shows an illustrative MEMS gyroscope with self-test in accordance with an embodiment of the present disclosure.

FIG. 9 shows an illustrative MEMS gyroscope in accordance with an embodiment of the present disclosure. In the depicted embodiment, an exemplary MEMS gyroscope 900 has a particular configuration for conducting a self-test, including a self-test signal generator, frequency mixers, self-test drive electrodes, drive electrodes, a proof mass, fixed electrodes, 90-degree phase shifts, a signal generator of processing circuitry, a capacitance to voltage (C2V) converter, an analog to digital converter, and a sense signal, s(t). It will be understood that modifications to any of the above may be made or other features may be added, such as additional self-test drive electrodes, additional drive electrodes, additional fixed electrodes, varied locations and types of processing circuitry, and additional circuitry such as additional processing circuitry (e.g., a host processor coupled to the processing circuitry of the MEMS gyroscope). Although a particular simplified gyroscope is depicted including an in-plane sensing proof mass 910, it will be understood the present disclosure may generally apply to any suitable gyroscope in which an appropriate non-periodic self-test signal is applied, e.g., as described with respect to FIG. 11. FIG. 9 depicts an exemplary gyroscope with a simple square wave (or other periodic) self-test signal, which is subject to interference from vibration.

The exemplary MEMS gyroscope 900 includes a self-test signal generator 902, which couples to a frequency mixer 904. The self-test signal generator 902 generates and delivers a periodic self-test signal pattern, p(t), to frequency mixer 904 to be coupled with a 90-degree phase shifted 914b drive signal generated by drive signal generator 916. The periodic self-test signal pattern, p(t), simulates a Coriolis movement in response to a rotation about an axis perpendicular to the sense direction of the proof mass 908, while the 90-degree phase shifted 914b drive signal corresponds to the translated drive motion to the proof mass 910. Frequency mixer 904 is coupled to self-test drive electrodes 906 (e.g., via drive circuitry, not depicted) to impart a movement on the proof mass 910 corresponding to the mixed signal, i.e., including the 90-degree phase shifted 914b drive signal and the periodic self-test signal pattern, such that the movement of the proof mass accurately simulates the Coriolis movement at the drive frequency, translated to the proof mass (e.g., 90-degree phase shifted) via the MEMS structure of the gyroscope (e.g., drive masses, springs, lever arms, Coriolis masses, etc). It will be understood that any suitable number of self-test drive electrodes 906 may be oriented on proof mass 910 in a variety of manners, as is necessary to impart the self-test movement on the proof mass 910. In the embodiment depicted in FIG. 9, self-test signal pattern includes two deflection pulses (e.g., a positive and a negative deflection pulse) applied in opposite directions on proof mass 910. In some embodiments, a self-test for the MEMS gyroscope 900 includes taking a difference of a positive deflection region and a negative deflection region and comparing the difference to a threshold value. In an environment with background rotational vibration (e.g., torque produced by a rotating shaft in a car engine), the difference may exceed the threshold value and be out-of-spec, resulting in the self-test registering as a "fail." Accordingly, the MEMS gyroscope 900 may prove to be sensitive to external vibrations, thus compromising its self-test capability. The movement of proof mass 910 according to the mixed signal is demonstrated in two embodiments by FIG. 10A and FIG. 10B, with and without an interfering external vibration.

The movement imparted on the proof mass 910 by the self-test drive electrodes 906 is sensed by sense electrodes 912 as changes in capacitance between the respective electrodes 912 and the proof mass 910. The changes in capacitance (e.g., differential changes) are received by C2V converter 918, which receives the capacitance output signals and converts the capacitance signals into a suitable output (e.g., voltage or current) that is based on (e.g., proportional to) the sensed differential capacitance voltage signals, and delivers the voltage signals to frequency mixer 920. Frequency mixer 920 receives a 90-degree phase shifted version of the drive signal, i.e., the same simulated translated drive signal that was imparted on the proof mass 910 by self-test drive electrodes 906, thus removing the drive signal portion of the output from C2V converter 918. The remaining baseband signal output from frequency mixer 920 includes the self-test signal pattern to the degree that motion was imparted on the proof mass, as well as any motion due to external forces such as environmental vibrations. Analog to digital converter 922 receives the analog baseband sensed signal from frequency mixer 920 and converts this signal into a digital signal (e.g., sense signal 924, s(t)). Sense signal 924, s(t), serves as an output signal of analog to digital converter 922 and includes the injected self-test signal pattern and an environmental signal.

In some embodiments, a self-test for the MEMS gyroscope 900 includes taking a combining an area of the deflection corresponding to with the positive deflection and an area of the negative deflection point imparted by the applied self-test signal and comparing the combined area to threshold values. In this manner, a movement that is substantially greater or less than an expected movement from the applied self-test signal may by indicative of damage to the gyroscope, such as damaged or worn springs. In an environment with background vibration (e.g., engine cranking in an automobile), environmental vibration may distort the reading associated with the self-test signal, resulting in the self-test incorrectly registering a "fail" or "pass" based on distortion to the self-test response of the proof mass to the self-test signal, not the self-test signal itself. Accordingly, certain vibration patterns may compromise self-test capability.

Figure 10:
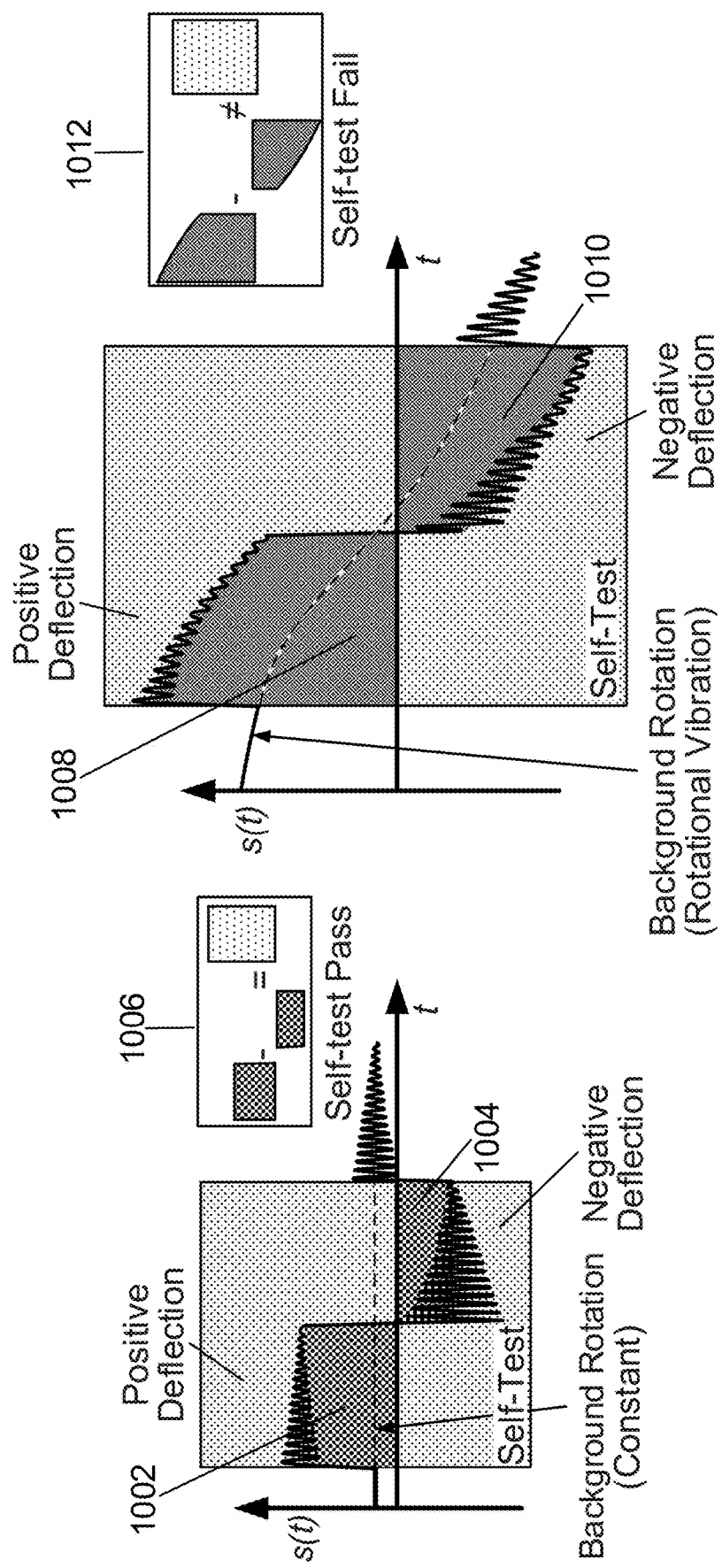
FIG. 10A shows an example diagram depicting a sense signal, s(t), as a function of time with constant background rotation in accordance with an embodiment of the present disclosure.
FIG. 10B shows an example diagram depicting a sense signal, s(t), as a function of time with background rotational vibration in accordance with an embodiment of the present disclosure.

FIG. 10A shows an example diagram depicting a sense signal, s(t), as a function of time with constant background rotation in accordance with an embodiment of the present disclosure. Although FIG. 10A shows two deflection pulses composing a single period of the sense signal, s(t), it will be understood that any suitable even number of deflection pulses may be recorded for any suitable number of periods of the sense signal, s(t). Sense signal, s(t), is integrated over two deflection pulses for the duration of the self-test, which is depicted by positive deflection region 1002 and negative deflection region 1004. A combined area 1006 of positive deflection region 1002 and negative deflection region 1004 is taken and compared to a threshold value. In the embodiment depicted in FIG. 10A, a rotation is experienced during the time that the test signal is applied to the proof mass, depicted by the baseline angular velocity (dotted) line exceeding zero. However, because the rotation is constant, the overall area 1006 is not affected by the background rotation. Thus, the overall area 1006 will be the same without regard to the underlying constant rotation. In the example embodiment depicted in FIG. 10, the area falls below a threshold and registers as a "Pass."

FIG. 10B shows an example diagram depicting a sense signal, s(t), as a function of time with background rotational vibration in accordance with an embodiment of the present disclosure. Although FIG. 10B shows two deflection pulses composing a single period of the sense signal, s(t), it will be understood that any suitable even number of deflection pulses may be recorded for any suitable number of periods of the sense signal, s(t). Sense signal, s(t), is integrated over two deflection pulses for the duration of the self-test, which is depicted by positive deflection region 1008 and negative deflection region 1010. A combined area 1012 of the positive deflection region 1008 and the negative deflection region 1010 is taken and compared to a threshold value. In the embodiment depicted in FIG. 10B, a background vibration causes a rotation that is time-varying, such that the background rotation (depicted with a dotted line) changes during the time period that the self-test signal is applied to the proof mass(es). As depicted in FIG. 10B, during the time between the beginning of the integration of the positive deflection 1008 and the end of the integration of the negative deflection 1010, the background rotation decreases significantly. This results in the combined area 1012 exceeding the actual combined area due to the test signal, causing incorrect test results when compared to test thresholds. Accordingly, non-constant background rotations negatively impact the accuracy of gyroscope self-test determinations. Because MEMS sensors are often installed in vehicles or other devices that create substantial vibrations, or are used in environments where such vibrations are regularly experienced, this traditional approach to self-test sensing may be significantly limited in such devices and environments. For example, in the embodiment of FIG. 10B, the peak-to-peak difference 1012 for the same displacement as in FIG. 10A results in a "Fail" of the self-test.

Figure 11:
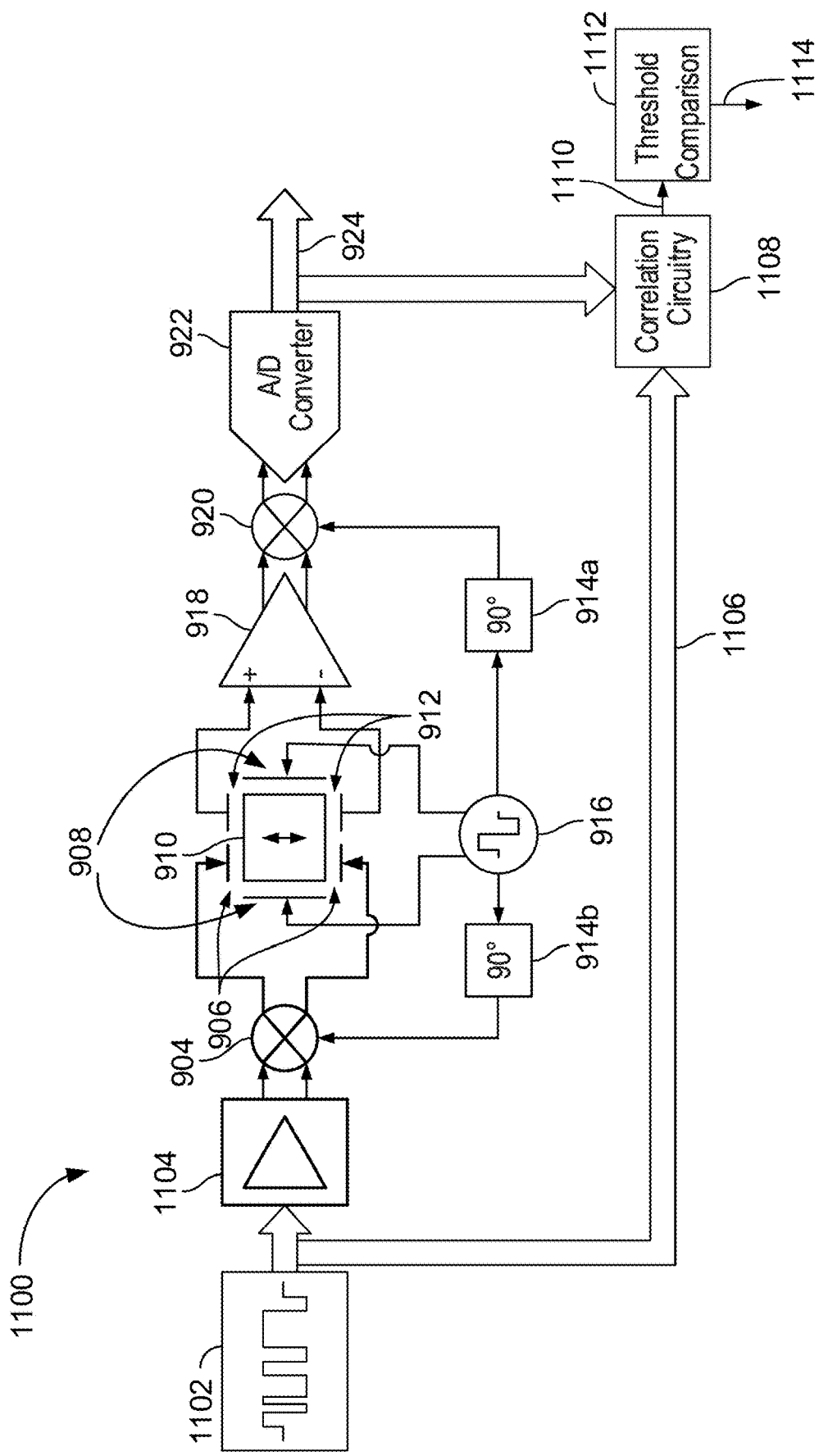
FIG. 11 shows an illustrative MEMS gyroscope with self-test in accordance with an embodiment of the present disclosure.

FIG. 11 shows an illustrative MEMS gyroscope in accordance with an embodiment of the present disclosure. The components of the MEMS gyroscope 900 of FIG. 9 are depicted in MEMS gyroscope 1100 of FIG. 11, except that self-test signal generator 1102 replaces self-test signal generator 902, self-test drive 1104 receives a non-periodic self-test signal pattern 1106, p(t), from the self-test signal generator 1102, self-test signal generator 1102 delivers the non-periodic self-test signal pattern 1106, p(t), to correlator 1108, and correlator 1108 delivers a correlation value 1110 to test circuitry 1112, which outputs a test output 1114. Although not depicted in FIG. 11, a delay element may also be included in the signal path 1106 between self-test signal generator 1102 and correlator 1108. As described with respect to FIG. 9, the MEMS gyroscope is not limited to the particular embodiment (components, sense axis, sensing configuration, etc.) depicted in FIG. 11, but can be applied to any MEMS gyroscope with a sense mass that is capable of being directly (e.g., based on self-test electrodes adjacent to a proof mass) or indirectly (e.g., based on self-test moving a mass or other element that causes movement of the proof mass) displaced by a self-test signal.

The self-test signal generator 902 generates and delivers non-periodic self-test signal pattern 1106 to frequency mixer 904 to be coupled with a 90-degree phase shifted 914b drive signal generated by drive signal generator 916. The periodic self-test signal pattern, p(t), simulates a Coriolis movement in response to a rotation about an axis perpendicular to the sense direction of the proof mass 908, while the 90-degree phase shifted 914b drive signal corresponds to the translated drive motion to the proof mass 910. Frequency mixer 904 is coupled to self-test drive electrodes 906 (e.g., via drive circuitry, not depicted) to impart a movement on the proof mass 910 corresponding to the mixed signal, i.e., including the 90-degree phase shifted 914b drive signal and the periodic self-test signal pattern, such that the movement of the proof mass accurately simulates the a Coriolis movement at the drive frequency, translated to the proof mass (e.g., 90-degree phase shifted) via the MEMS structure of the gyroscope (e.g., drive masses, springs, lever arms, Coriolis masses, etc). It will be understood that any suitable number of self-test drive electrodes 906 may be oriented on proof mass 910 in a variety of manners, as is necessary to impart the self-test movement on the proof mass 910.

Self-test signal generator 1102, which couples to self-test drive 1104 and correlator 1108 (e.g., via a delay element, not depicted in FIG. 11), generates and delivers a non-periodic self-test signal pattern 1106, p(t), to the self-test drive 1104 and the correlator 1108 to simulate a rotation about an axis of interest (e.g., corresponding to rotation about an axis perpendicular to the axis of a Coriolis force causing movement of the proof mass 910). The non-periodic self-test pattern may be selected in a manner such that environmental vibrations, and the modes in which those environmental vibrations couple to the proof mass via the components of the MEMS gyroscope, have a substantially different signal pattern from the non-periodic self-test signal pattern 1106 such that a correlation between the movement caused on the proof mass by the environmental vibration and the non-periodic self-test signal is relatively small. In some embodiments, the non-periodic self-test signal pattern 1106, p(t), may include an anti-symmetric chirp pattern, which features zero average and variable frequency that results in little correlation error, $C_{err}$, with a fixed-frequency vibration, making the non-periodic self-test signal pattern 1106, p(t), resistant against strong, low frequency vibrations (e.g., engine cranking in an automobile). In some embodiments, the non-periodic self-test signal pattern 1106, p(t), may include a zero-average random pattern, which features zero average and "white noise" (e.g., a flat power spectral density) frequency content. This particular embodiment may be more effective against weak vibrations with broad frequency range (e.g., in the audio frequency range of 20 Hz to 20 kHz). In some embodiments, the MEMS gyroscope may ring on sharp transitions from +1 to −1 and vice versa. The ringing may be due to the resonant nature of the MEMS and may build up to very high levels when many transitions are applied in a short time. Mitigation measures may include some form of transition smoothing such as, for example, zero-padding (e.g., +1 to a short zero to −1), ramp (e.g., +1 is linearly ramped to −1), or smoother transitions.

The first property of the non-periodic self-test signal pattern 1106, p(t), is zero average, such that a rotation having a constant angular velocity is rejected. In some embodiments, the non-periodic self-test signal pattern 1106, p(t), may be delayed by a delay time, wherein the delay time corresponds to a propagation time for the self-test drive electrodes 906 receiving the non-periodic self-test signal pattern 1106, p(t), to processing circuitry generating the sense signal 924, s(t). The non-periodic self-test signal pattern 1106, p(t), includes a sequence of +1 and −1, which aids in applying the non-periodic self-test signal pattern 1106, p(t), to the proof mass 910 via the self-test drive electrodes 906 and calculating the correlation value 1110. In some embodiments, the non-periodic self-test signal pattern 1106, p(t), may include a multi-valued amplitude pattern, which may result in a smaller correlation error, $C_{err}$.

The movement imparted on the proof mass 910 by the self-test drive electrodes 906 is sensed by sense electrodes 912 as changes in capacitance between the respective electrodes 912 and the proof mass 910. The changes in capacitance (e.g., differential changes) are received by C2V converter 918, which receives the capacitance output signals and converts the capacitance signals into a suitable output (e.g., voltage or current) that is based on (e.g., proportional to) the sensed differential capacitance voltage signals, and delivers the voltage signals to frequency mixer 920. Frequency mixer 920 receives a 90-degree phase shifted version of the drive signal, i.e., the same simulated translated drive signal that was imparted on the proof mass 910 by self-test drive electrodes 906, thus removing the drive signal portion of the output from C2V converter 918. The remaining baseband signal output from frequency mixer 920 includes the non-periodic self-test pattern to the degree that motion was imparted on the proof mass, as well as any motion due to external forces such as environmental vibrations. Analog to digital converter 922 receives the analog baseband sensed signal from frequency mixer 920 and converts this signal into a digital signal (e.g., sense signal 924, s(t)).

The sensed motion of the proof mass due to non-periodic self-test signal pattern 1106, $s_p(t)$, partially composes, along with the environmental signal, $s_e(t)$, the sense signal 924, s(t). Correlator 1108, which receives the non-periodic self-test signal pattern 1106, p(t) (or a delayed version thereof), from self-test signal generator 1102 and the sense signal 924, s(t), from analog to digital converter 922. Correlator 1108 correlates the sense signal 924, s(t), with a time-aligned version of the non-periodic self-test signal pattern 1106, p(t), to generate the correlation value 1110 based on the correlation between the two signals. The correlator 1108 correlates the sense signal 924 with the non-periodic self-test signal pattern 1106 over the time period during which the non-periodic self-test signal pattern 1106 was applied to the proof mass 910. The resulting correlation value 1110 thus represents the correlation of the non-periodic self-test signal pattern 1106 to the sense signal, in turn, representing the degree to which the non-periodic self-test signal pattern 1106 caused movement of the proof mass 1108. Concurrently, correlator 1108 substantially eliminates any impact of the environmental signal, $s_e(t)$, on the correlation value, based on the vibration not correlating with the non-periodic self-test signal pattern 1106. Accordingly, a contribution of a correlation error, $C_{err}$ (e.g., a portion of the signal not corresponding to the desired signal corresponding to the self-test input) from sense signal 924 is minimized. Correlation value 1110, generated from the correlation of the sense signal 924 with the non-periodic self-test signal pattern 1106 by the correlator 1108, is fed to test circuitry 1112 by the correlator 1118 and compared to a threshold value. The test circuitry 1112 receives the correlation value 1110 from correlator 1108 and compares the correlation value 1110 to the threshold value(s) to determine the test output 1114. For example, if the correlation value 1110 does not exceed a first threshold value, the test circuitry 1112 registers the self-test as a "pass" on an upper threshold test via test output 1114. As another example, if the correlation value 1110 does not fall below a second threshold value, test circuitry 1112 registers the self-test as a "pass" on a lower threshold test via output 1114. Based on the proper selection of the self-test signal pattern, the threshold comparisons are based on the response of the proof mass to the non-periodic self-test signal pattern 1106, not the external vibration. Other test protocols other than threshold comparisons may be used in addition to or as substitutes for the threshold comparison. Another exemplary test protocol may apply multiple different non-periodic self-test patterns and determine a pass or fail based on an average or other aggregation of multiple results. Another exemplary test protocol my apply different peak-to-peak signal amplitudes for the same or similar non-periodic self-test patterns, effectively testing a range of operation of the proof mass over the entirety of its operating range. Another exemplary test protocol monitors changes in the self-test signal response over time, for example, by monitoring for a rate of changes that exceeds a threshold.

Figure 12A:
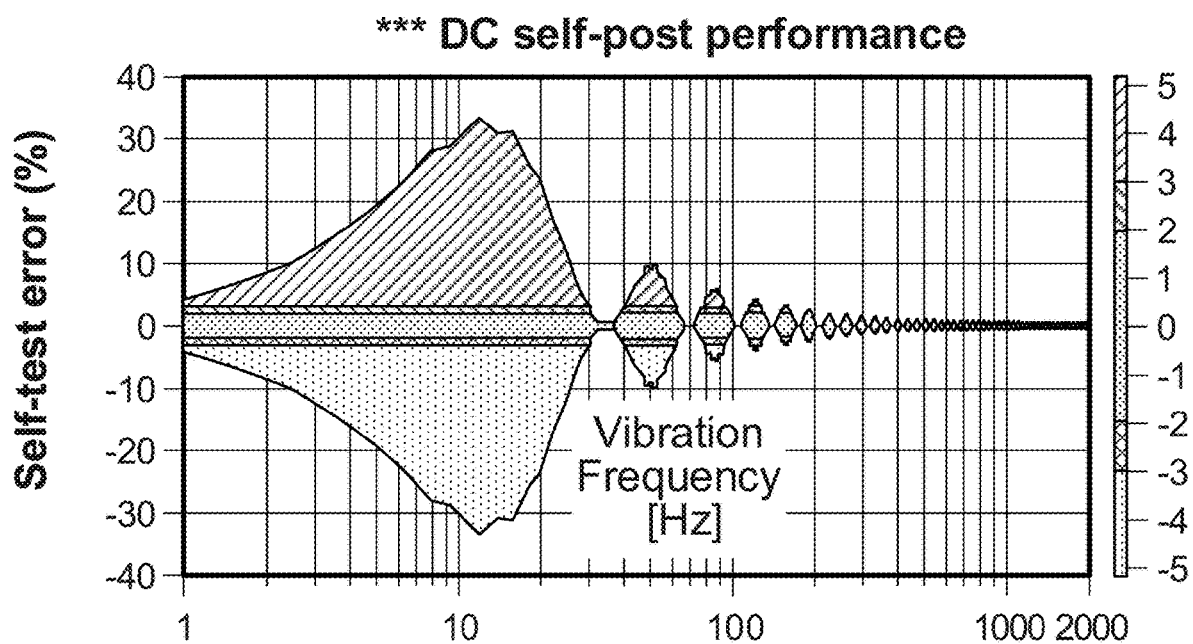
FIG. 12A shows an example diagram depicting self-test robustness to rotation vibrations in accordance with a prior art self-test methodology.

FIG. 12A shows an example diagram depicting self-test robustness of a MEMS gyroscope to vibrations in accordance with prior art self-test methodology. FIG. 12A depicts a product (e.g., an automotive MEMS gyroscope sensor) self-test simulated with Matlab, which represents simulated self-test error mask percentage at various external vibration frequencies (e.g., DC to 2 kHz). The maximum self-test error percentage exceeds 30% at relatively low frequencies.

Figure 12B:
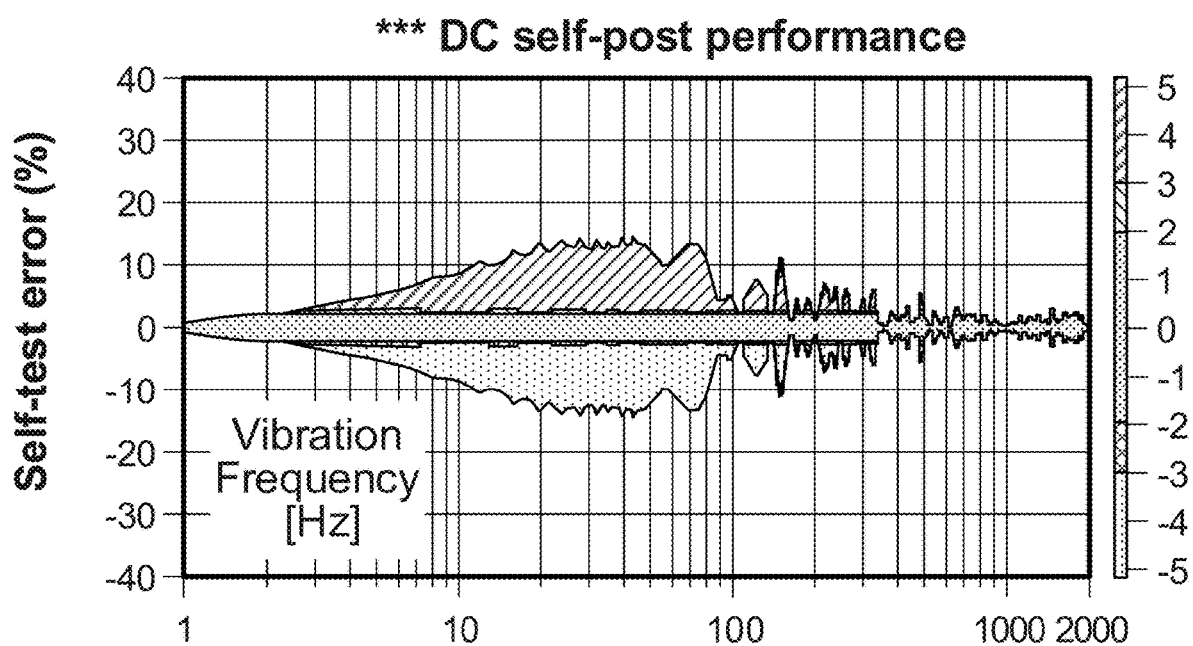
FIG. 12B shows an example diagram depicting self-test robustness to rotation vibrations in accordance with an embodiment of the present disclosure.

FIG. 12B shows an example diagram depicting self-test robustness to vibrations in accordance with an embodiment of the present disclosure (e.g., utilizing the circuitry and self-test described with respect to FIG. 11). FIG. 12B depicts a product (e.g., an automotive MEMS sensor) self-test simulated with Matlab, which represents simulated self-test error mask percentage at various rotational vibration frequencies (e.g., DC to 2 kHz). The maximum self-test error percentage is around 10% and is lower than the prior-art methodology in most frequency ranges, allowing for more accurate self-test.

The foregoing is merely illustrative of the principles of this disclosure and various modifications may be made by those skilled in the art without departing from the scope of this disclosure. The embodiments described herein are provided for purposes of illustration and not of limitation. Thus, this disclosure is not limited to the explicitly disclosed systems, devices, apparatuses, components, and methods, and instead includes variations to and modifications thereof, which are within the spirit of the attached claims The systems, devices, apparatuses, components, and methods described herein may be modified or varied to optimize the systems, devices, apparatuses, components, and methods. Although the present disclosure has been described with respect to an exemplary sensor such as a MEMS accelerometer and a MEMS gyroscope, it will be understood that the inventions described in the present disclosure may apply equally to other sensors that may be excited by test signals while being exposed to a high vibration environment, such as pressure sensors, ultrasonic sensors, time-of-flight sensors, and the like.

What is claimed is:

1. A method for performing a self-test of an inertial sensor, comprising:
generating, by processing circuitry of the inertial sensor, a drive signal;
generating, by processing circuitry of the inertial sensor, a non-periodic self-test signal pattern;

providing the drive signal to one or more drive electrodes of the inertial sensor;

providing the non-periodic self-test signal pattern to one or more self-test drive electrodes of the inertial sensor;

providing, by the one or more drive electrodes, the drive signal to a proof mass of the inertial sensor, wherein the drive signal functions as a carrier signal for a vibration of the proof mass;

driving, by the one or more self-test drive electrodes, the proof mass of the inertial sensor in accordance with the non-periodic self-test signal pattern;

sensing, by one or more sense electrodes of the inertial sensor, the movement of the proof mass while the proof mass is driven by the one or more self-test drive electrodes;

generating, by the processing circuitry of the inertial sensor, a received signal based on the sensed movement of the proof mass;

removing the carrier signal from the received signal to generate a sense signal;

correlating, by the processing circuitry, the sense signal directly with the non-periodic self-test signal pattern; and identifying, by the processing circuitry, an error based on the correlating.

2. The method of claim 1, wherein the non-periodic self-test signal pattern comprises an anti-symmetric chirp pattern.

3. The method of claim 1, wherein the non-periodic self-test signal pattern comprises a zero-average random pattern.

4. The method of claim 3, wherein the zero-average random pattern comprises a plurality of signal amplitudes.

5. The method of claim 1, further comprising delaying the non-periodic self-test signal pattern before correlating, by the processing circuitry, the sense signal with the non-periodic self-test signal pattern.

6. The method of claim 5, wherein the delaying corresponds to a delay in time, and wherein the delay in time corresponds to a propagation time for the non-periodic self-test signal pattern from the self-test drive electrodes receiving the non-periodic self-test signal pattern to the processing circuitry generating the sense signal.

7. The method of claim 1, wherein identifying the error based on the correlating comprises:

determining a correlation value based on correlating the sense signal with the non-periodic self-test signal pattern;

comparing the correlation value to a high threshold value; and identifying an error when the correlation value exceeds the high threshold value.

8. The method of claim 1, wherein identifying the error based on the correlating comprises:

determining a correlation value based on correlating the sense signal with the non-periodic self-test signal pattern;

comparing the correlation value to a low threshold value; and identifying an error when the correlation value is below the low threshold value.

9. The method of claim 1, wherein the non-periodic self-test signal pattern is selected to reduce a correlation with vibrational noise within a frequency range of interest.

10. The method of claim 8, wherein the frequency range of interest begins at 200 Hz.

11. The method of claim 8, wherein the frequency range of interest begins at 1 kHz.

12. The method of claim 1, wherein the inertial sensor comprises an accelerometer.

13. The method of claim 1, wherein the inertial sensor comprises a gyroscope.

14. The method of claim 1, wherein the sense signal comprises the non-periodic self-test signal pattern and an environmental signal, and wherein the environmental signal is substantially eliminated based on the correlating.

15. The method of claim 13, wherein the environmental signal is gravity or sinusoidal vibrations with a broad frequency range.

16. The method of claim 1, wherein the non-periodic self-test signal pattern comprises a multi-valued amplitude pattern.

17. An inertial sensor with self-test capability, comprising: a first signal generator that generates a drive signal; a second signal generator that generates a non-periodic self-test signal pattern; one or more drive electrodes that receive the drive signal; one or more self-test drive electrodes that receive the non-periodic self-test signal pattern; a proof mass that is driven by the one or more self-test drive electrodes in accordance with the non-periodic self-test signal pattern and by the one or more drive electrodes in accordance with the drive signal, wherein the drive signal functions as a carrier signal for a vibration of the proof mass; one or more sense electrodes that sense movement of the proof mass; sense circuitry coupled to the proof mass, wherein the sense circuitry is configured to generate a received signal based on the sensed movement of the proof mass detected by the one or more sense electrodes; a frequency mixer configured to remove the carrier signal from the received signal to generate a sense signal; and processing circuitry configured to correlate the sense signal directly with the non-periodic self-test signal pattern and identify an error based on the correlation.

18. The inertial sensor of claim 17, wherein the non-periodic self-test signal pattern comprises an anti-symmetric chirp pattern.

19. The inertial sensor of claim 17, wherein the non-periodic self-test signal pattern comprises a zero-average random pattern.

20. The inertial sensor of claim 19, wherein the zero-average random pattern comprises a plurality of signal amplitudes.

21. A method for performing a self-test of an inertial sensor, comprising:

generating, by processing circuitry of the inertial sensor, a drive signal;

generating, by processing circuitry of the inertial sensor, a non-periodic self-test signal pattern;

providing the drive signal to a proof mass of the inertial sensor, wherein the drive signal functions as a carrier signal for a vibration of the proof mass;

driving the proof mass in accordance with the non-periodic self-test signal pattern;

sensing, by one or more sense electrodes of the inertial sensor, the movement of the proof mass while the proof mass is driven by the one or more self-test drive electrodes;

generating, by the processing circuitry of the inertial sensor, a received signal based on the sensed movement of the proof mass, wherein the sensed movement is based on the driving of the proof mass and an environmental vibration;

removing the carrier signal from the received signal to generate a sense signal;

correlating, by the processing circuitry, the sense signal directly with the non-periodic self-test signal pattern, wherein an environmental vibration portion of the signal is not correlated with the non-periodic self-test signal pattern and a driven portion of the sense signal is correlated with the non-periodic self-test signal pattern; and identifying, by the processing circuitry, an error based on the correlating.

* * * * *